(12) United States Patent
Wilson et al.

(10) Patent No.: US 11,936,335 B2
(45) Date of Patent: Mar. 19, 2024

(54) ROLLABLE TAPE SPRING SOLAR ARRAY

(71) Applicant: MOMENTUS SPACE LLC, San Jose, CA (US)

(72) Inventors: Lee Wilson, San Jose, CA (US); Luigi Celano, San Jose, CA (US); Garun Arustamov, San Jose, CA (US); Jason Park, San Jose, CA (US); Derek Wong, San Jose, CA (US)

(73) Assignee: MOMENTUS SPACE LLC, San Jose, CA (US)

( * ) Notice: Subject to any disclaimer, the term of this patent is extended or adjusted under 35 U.S.C. 154(b) by 0 days.

(21) Appl. No.: 17/390,790

(22) Filed: Jul. 30, 2021

(65) Prior Publication Data
US 2023/0035174 A1 Feb. 2, 2023

(51) Int. Cl.
| | |
|---|---|
| *H02S 30/20* | (2014.01) |
| *B64G 1/22* | (2006.01) |
| *B64G 1/44* | (2006.01) |
| *H01L 31/046* | (2014.01) |
| *H02S 10/40* | (2014.01) |
| *H02S 40/22* | (2014.01) |

(52) U.S. Cl.
CPC .............. *H02S 30/20* (2014.12); *B64G 1/222* (2013.01); *B64G 1/443* (2013.01); *H01L 31/046* (2014.12); *H02S 10/40* (2014.12); *H02S 40/22* (2014.12)

(58) Field of Classification Search
CPC .......... H02S 30/20; H02S 10/40; H02S 40/22; B64G 1/443; B64G 1/222; H01L 31/046
See application file for complete search history.

(56) References Cited

U.S. PATENT DOCUMENTS

| | | | | |
|---|---|---|---|---|
| 8,636,253 | B1 * | 1/2014 | Spence | H02S 30/20 |
| | | | | 244/172.8 |
| 9,156,568 | B1 * | 10/2015 | Spence | B64G 1/44 |
| 9,660,123 | B2 | 5/2017 | O'Neill | |
| 10,059,471 | B2 * | 8/2018 | Steele | B64G 1/443 |
| 10,239,642 | B1 * | 3/2019 | Spence | H02S 30/20 |
| 10,992,253 | B2 * | 4/2021 | Atwater | H02S 30/20 |
| 2012/0167943 | A1 | 7/2012 | Blanchard et al. | |

(Continued)

FOREIGN PATENT DOCUMENTS

| | | |
|---|---|---|
| EP | 1043228 A2 | 10/2000 |
| EP | 3012193 A1 | 4/2016 |
| JP | S58-136900 | 9/1983 |

OTHER PUBLICATIONS

J.M. Fernandez, "Advanced Deployable Shell-based Composite Booms for Small Satellite Structural Applications Including Solar Sails", No. NF1676L-25486, 2017, 19 pages.

(Continued)

*Primary Examiner* — Angelo Trivisonno
(74) *Attorney, Agent, or Firm* — MARSHALL, GERSTEIN & BORUN LLP (57) ABSTRACT

A system for harvesting solar energy on a spacecraft includes a stiff substrate layer and a working layer disposed on the substrate layer to provide at least one of a photovoltaic or a reflective function. In a first operational state, the substrate layer is arranged as a tape spring to store potential energy which causes the substrate layer to uncoil and provide, in a second operational state, a photovoltaic module and/or a solar concentrator.

23 Claims, 11 Drawing Sheets

(56) References Cited

U.S. PATENT DOCUMENTS

| | | | | |
|---|---|---|---|---|
| 2014/0326833 | A1* | 11/2014 | Spence | B64G 1/443 |
| | | | | 244/172.7 |
| 2016/0137319 | A1 | 5/2016 | Steele et al. | |
| 2021/0028745 | A1* | 1/2021 | Sekine | H01L 31/048 |

OTHER PUBLICATIONS

Fernandez et al., "Bistability in Collapsible Tubular Mast Booms", AIAA SciTech 2019 Forum, Jan. 7-11, 2019, 16 pages.

Leclerc et al. "Characterization of ultra-thin composite triangular rollable and collapsible booms", 4th AIAA spacecraft structures conference, 2017, 15 pages.

Leclerc et al., "Ultra-thin composite deployable booms." Proceedings of the IASS Annual Symposium, No. 13. International Association for Shell and Spatial Structures (IASS), Sep. 25-28, 2017, 10 pages.

Wilson, Lee L., "Analysis of Packaging and Deployment of Ultralight Space Structures", Diss. California Institute of Technology, 2017, 175 pages.

Brown, Michael A, "A deployable mast for solar sails in the range of 100-1000 m", Advances in Space Research 48.11 (2011), pp. 1747-1753.

Baranowski, et al., "Concentrated solar thermoelectric generators." Energy & Environmental Science 5.10, 2012, 9055-9067.

Dow Corning, "93-500 Space-Grade Encapsulant", Product Information. Ref. No: 10-1062, 1998, 4 pages.

Ma, et al., "Optical design of a solar dish concentrator based on triangular membrane facets", International Journal of Photoenergy, 2012, 7 pages.

O'Neill, et al., "Stretched Lens Array SquareRigger (SLASR) Technology Maturation." Proceedings of the 19th Space Photovoltaic Research and Technology Conference, 2007, 14 pages.

O'Neill, et al., "Stretched Lens Array SquareRigger (SLASR): a New Space Array for High-Power Missions", 2006 IEEE 4th World Conference on Photovoltaic Energy Conference. vol. 2. IEEE, 2006, 4 pages.

Xie, et al., "Concentrated solar energy applications using Fresnel lenses: a review", Renewable and Sustainable Energy Reviews 15.6, 2011, 2588-2606.

Cao, Yue. "Rigid origami of thick panels and deployable membranes", Diss. University of Oxford, 2017, 152 pages.

Campbell, et al., "Development of a novel, passively deployed roll-out solar array", 2006 IEEE Aerospace Conference, IEEE, 2006, 10 pages.

Pappa, et al., "Compact telescoping surface array for mars solar power", 2018 AIAA Spacecraft Structures Conference, 2018, 24 pages.

Wikipedia contributors, "Roll Out Solar Array." Wikipedia, The Free Encyclopedia, Wikipedia, The Free Encyclopedia, Jul. 26, 2022. Web. Aug. 24, 2022, 7 pages.

Rauschenbach, Hans S., "Solar cell array design handbook: the principles and technology of photovoltaic energy conversion", Springer Science & Business Media, 2012.

Fulton, et al., "Advanced optical coating technology used in the development of concentrator arrays for solar space power applications", Advances in Thin-Film Coatings for Optical Applications III. vol. 6286. SPIE, 2006.

Kuo, et al., "Fabrication of the Fresnel lens with liquid silicone rubber using rapid injection mold", The International Journal of Advanced Manufacturing Technology 101.1 (2019), pp. 615-625.

O'Neill, et al., "Ultralight stretched Fresnel lens solar concentrator for space power applications", Optical Materials and Structures Technologies, vol. 5179, SPIE, 2003.

Zhang, et al., "A rigid thick Miura-Ori structure driven by bistable carbon fibre-reinforced polymer cylindrical shell", Composites Science and Technology 167, 2018, pp. 411-420.

Li, et al., "Deployment and Control of Spacecraft Solar Array Considering Joint Stick-slip Friction", Aerospace Science and Technology, vol. 42, 2015, pp. 342-352.

Ma et al., "Optimization on a Cylindrical Fresnel Lens and Its Validation in a Medium-temperature Solar Steam Generation System", Renewable Energy, vol. 134, 2019, pp. 1332-1343.

Thesis by Lee Wilson, "Analysis of Packaging and Deployment of Ultralight Space Structures", California Institute of Technology, Apr. 25, 2017, 175 pages.

Search Report and Written Opinion in International Application No. PCT/US2022/038877 dated Nov. 4, 2022, 17 pages.

* cited by examiner

FIG. 8
ROLLABLE TAPE SPRING SOLAR ARRAY

FIELD OF THE DISCLOSURE

The disclosure generally relates to using solar energy on a spacecraft and, more specifically, to efficient storage and deployment of a solar array and/or solar concentrator on a spacecraft.

BACKGROUND

With increased commercial activity in the near space, a variety of spacecraft and missions are under development. Spacecraft can be equipped with a rollable solar arrays, which are versatile devices that can be stowed during launch and unrolled in space to operate as power sources.

Today, rollable solar arrays require bulky booms for deployment from the stowed configuration as well as mechanical frames that provide the solar array with rigid supports to ensure that the solar array unrolls correctly. Once unrolled, the booms further provide a tension to the solar array to stiffen the array and ensure that the solar array maintains a desired shape. These types of rollable solar array systems are bulky and have a number of possible failure modes. For example, the booms may yield, buckle, or bend due to the compression experienced by tensioning the array. These mechanical errors are further more likely with unevenly heated booms, or if there is any mechanical bending of the booms due to manufacturing error. Once the solar array has yielded, it may not be possible to fix the solar array on a spacecraft in orbit, which reduces the solar arrays efficiency, or worse, results in an inoperable solar array.

SUMMARY

A system of this disclosure includes a panel with a photovoltaic layer and/or a reflective layer to provide a solar array and/or a solar concentrator on a spacecraft. In a stored (or stowed) configuration, e.g., in the form of a tape spring, the panel stores potential energy which, when the panel is released from the stored configuration, causes the panel to unroll. To this end, the panel can include a stiff substrate made of aluminum, stainless steel, carbon fiber, fiberglass, or another suitable material. A working layer with photovoltaic and/or reflective elements can be bonded directly to the substrate. The substrate can be shaped to define a cross-section, along the perpendicular direction of unrolling, having a radius of curvature along the perpendicular direction defining a circular, aspheric, or cylindrical surface. Further, the substrate can be shaped to define a cross-section along the direction of unrolling and, in some implementations, another cross-section along the perpendicular direction which causes the panel to define a spherical cap in the unrolled configuration. As discussed below, the system advantageously eliminates the need to rely on external booms for deployment.

An example embodiment of these techniques is a system for harvesting solar energy on a spacecraft. The system includes a stiff substrate layer and a working layer disposed on the substrate layer to provide at least one of a photovoltaic or a reflective function. The substrate layer, in a first operational state, is arranged as a tape spring to store potential energy which causes the substrate layer to uncoil and provide, in a second operational state, a photovoltaic module and/or a solar concentrator.

Another example embodiment of these techniques is a method of providing a photovoltaic module and/or a solar concentrator in a spacecraft. The method includes depositing a working layer on a stiff substrate layer, the working layer configured to provide at least one of a photovoltaic or a reflective function; and arranging the substrate layer in a stowed configuration on a spacecraft, wherein the substrate layer in the stowed configuration is configured to store potential energy which, when the substrate layer is released from the stowed configuration, causes the substrate layer to provide a photovoltaic module and/or a solar concentrator for the spacecraft, in an unfolded configuration.

DETAILED DESCRIPTION

A spacecraft may use a self-expanding solar array of this disclosure as a power source that provides electrical energy for electro-thermal or electrochemical propulsion, as solar sails for solar propulsion, and for other purposes. For convenience, the techniques of this disclosure are described primarily with reference to an array of photovoltaic cells (a "solar array"), but a system of this disclosure alternatively can include a solar concentrator or a combination of a solar concentrator and a solar array.

A rollable solar array of this disclosure forms a compact solar array bundle during launch, to reduce the overall volume and mass envelope. The solar array in the coiled state stores potential energy which, when released, drives the solar array to the uncoiled state. In some implementations, the energy is sufficient to completely eliminate the need for auxiliary devices such as booms, motors, or springs. The solar array thus may store enough potential energy to unroll unassisted and maintain the desired physical shape after unrolling. Unrolling of the solar array may also be referred to herein as "deployment" of the solar array. In other implementation, the arrangement of the solar array in the coiled state partially reduces the number and/or the size of auxiliary devices.

In contrast to these techniques, large structural booms typically are used to enable the roll-out of the solar array, and to maintain a desired shape of the solar array. The booms add weight to the spacecraft and consequently reduce the available payload weight. Further, the booms are often required for unrolling of the solar array and to provide a sustained tension on the solar array after deployment in space. In addition to reducing the part count, eliminating the need for booms and mechanical support elements for rolling out and maintaining a shape of the solar array improves spacecraft efficiency during launch, increases available payload weight and volume, and reduces the potential for structural failures, such as buckling. Further, depositing a photovoltaic layer onto a substrate results in lower-temperature gradients across the thickness of the solar array when the system is heated by the sun in space. As a result, the photovoltaic cells bend less after deployment.

Moreover, the disclosed tape spring rollable solar arrays also are more tolerant to manufacture error as compared to systems that require booms. The tape spring design also provides a stiffness in both a transverse and longitudinal directions of the solar panel array (the traditional approach at most provides array stiffness in the longitudinal direction), and reflective elements for solar concentration can be added to the solar panel array without increased design complexity. If a mechanical failure or any buckling of the tape spring solar panel array does occur, the disclosed system is able to recover by coiling the solar array panel, and redeploying (i.e., uncoiling) of the rollable solar array panel.

As also discussed below, implementations of the disclosed rollable solar array may include mechanical elements that apply a force against the direction, or rotation, of the unrolling to control a speed of the unrolling of the solar panel. Controlling the speed of the unrolling may prevent structure damage or malfunctioning of the solar panel or other mechanical elements of the rollable solar panel. Elements that may provide a reverse force (i.e., force in a direction opposing the direction of the rollout of the solar array) may include one or more of a motor, a spring, a fluidic piston, or another means for providing a force against the direction of the unrolling. The disclosed rollable solar array is scalable in both the length and width of the solar array, as well as easily scalable as multiple rollable solar arrays configured to receive solar radiation across a composite larger surface area of the multiple solar arrays.

Figure 1:
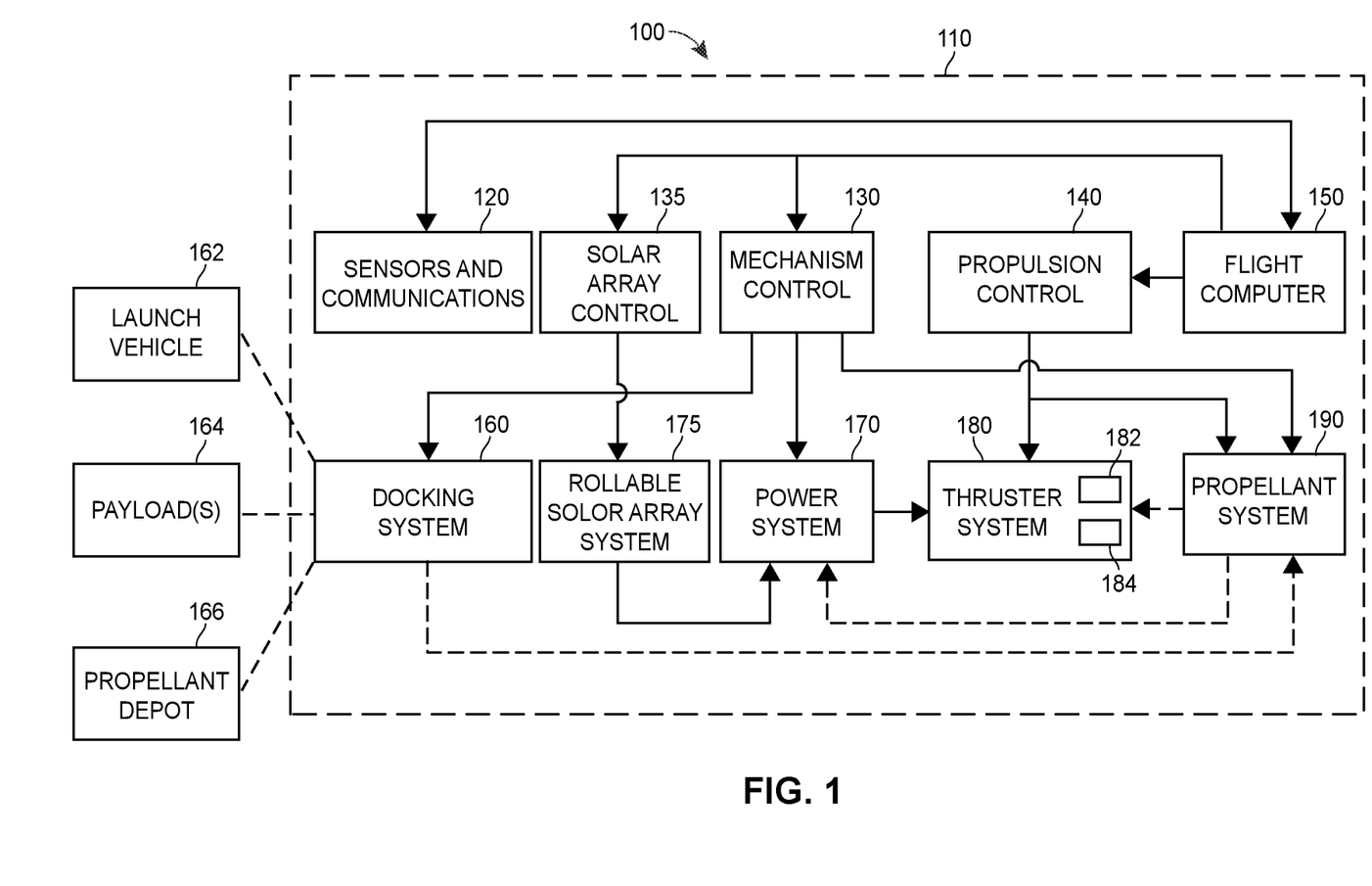
FIG. 1 is a block diagram of a spacecraft in which a rollable solar array system of this disclosure can be used.

For clarity, an example spacecraft in which the solar array of this disclosure can be implemented is discussed with reference to FIG. 1.

A spacecraft 100 may include the disclosed system for harvesting solar energy with a rollable solar array. The spacecraft 100 in general includes a number of systems, subsystems, units, or components disposed in or at a housing 110. The subsystems of the spacecraft 100 may include sensors and communications components 120, mechanism control 130, solar array control 135, propulsion control 140, a flight computer 150, a docking system 160 (for attaching to a launch vehicle 162, one or more payloads 164, a propellant depot 166, etc.), a power system 170, rollable solar array system 175, a thruster system 180 that includes a primary propulsion (main) thruster subsystem 182 and an attitude adjustment thruster subsystem 184, and a propellant system 190. Furthermore, any combination of subsystems, units, or components of the spacecraft 100 involved in determining, generating, and/or supporting spacecraft propulsion (e.g., the mechanism control 130, the propulsion control 140, the flight computer 150, the power system 170, the thruster system 180, and the propellant system 190) may be collectively referred to as a propulsion system of the spacecraft 100. The solar array control 135, and the rollable solar array system 175 may together perform as a system for harvesting solar energy as described. Further, the solar array control 135 and the rollable solar array system 175 may be part of the power system 170 to provide power to different components of the spacecraft 100.

The sensors and communications components 120 may include a number of sensors and/or sensor systems for navigation (e.g., imaging sensors, magnetometers, inertial motion units (IMUs), Global Positioning System (GPS) receivers, etc.), temperature, pressure, strain, radiation, and other environmental sensors, as well as radio and/or optical communication devices to communicate, for example, with a ground station, and/or other spacecraft. The sensors and communications components 120 may be communicatively connected with the flight computer 150, for example, to provide the flight computer 150 with signals indicative of information about spacecraft position and/or commands received from a ground station.

The flight computer 150 may include one or more processors, a memory unit, computer readable media, to process signals received from the sensors and communications components 120 and determine appropriate actions according to instructions loaded into the memory unit (e.g., from the computer readable media). Generally, the flight computer 150 may be implemented using any suitable combination of processing hardware, that may include, for example, applications specific integrated circuits (ASICS) or field programmable gate arrays (FPGAs), and/or software components. The flight computer 150 may generate control messages based on the determined actions and communicate the control messages to the mechanism control 130 and/or the propulsion control 140. For example, upon receiving signals indicative of a position of the spacecraft 100, the flight computer 150 may generate a control message to activate one of the thruster subsystems 182, 184 in the thruster system 180 and send the message to the propulsion control 140. The flight computer 150 may also generate messages to activate and direct sensors and communications components 120. The flight computer 150 may provide signals to the solar array controller 135 to control uncoiling (i.e., unrolling) or coiling of the rollable solar array.

The docking system 160 may include a number of structures and mechanisms to attach the spacecraft 100 to a launch vehicle 162, one or more payloads 164, and/or a propellant refueling depot 166. The docking system 160 may be fluidicly connected to the propellant system 190 to enable refilling the propellant from the propellant depot 166. Additionally or alternatively, in some implementations at least a portion of the propellant may be disposed on the launch vehicle 162 and outside of the spacecraft 100 during launch. The fluidic connection between the docking system 160 and the propellant system 190 may enable transferring the propellant from the launch vehicle 162 to the spacecraft 100 upon delivering and prior to deploying the spacecraft 100 in orbit.

The power system 170 may include components for collecting solar energy, generating electricity and/or heat, storing electricity and/or heat, and delivering electricity and/or heat to the thruster system 180. To collect solar energy, the power system 170 may include solar panels with photovoltaic cells, solar collectors or concentrators with mirrors and/or lenses, or a suitable combination of devices. In the case of using photovoltaic devices, the power system 170 may convert the solar energy into electricity and store it in energy storage devices (e.g., lithium ion batteries, fuel cells, etc.) for later delivery to the thruster system 180 and other spacecraft components. For example, the rollable solar array system 175, in an uncoiled state, may be used to harvest solar energy and provide the harvested energy to the power system 170.

In some implementations, the power system 180 may deliver at least a portion of the generated electricity directly (i.e., bypassing storage) to the thruster system 180 and/or to other spacecraft components. When using a solar concentrator, the power system 170 may direct the concentrated (having increased irradiance) solar radiation to photovoltaic solar cells to convert to electricity. For example, the rollable solar array system 175 may be, or otherwise include, a solar concentrator in the uncoiled state, allowing for focusing of solar radiation onto energy harvesting elements. In other implementations, the power system 170 may direct the concentrated solar energy to a solar thermal receiver or simply, a thermal receiver, that may absorb the solar radiation to generate heat. The power system 170 may use the generated heat to power a thruster directly, and/or to generate electricity using, for example, a turbine or another suitable technique (e.g., a Stirling engine). The power system 170 then may use the electricity directly for generating thrust or storing electrical energy.

The thruster system 180 may include a number of thrusters and other components configured to generate propulsion or thrust for the spacecraft 100. Thrusters may generally include main thrusters in the primary propulsion subsystem 182 that are configured to substantially change speed of the spacecraft 100, or as attitude control thrusters in the attitude control thruster subsystem 184 that are configured to change direction or orientation of the spacecraft 100 without substantial changes in speed.

One or more thrusters in the primary propulsion subsystem 182 may be a microwave-electro-thermal (MET) thrusters. In a MET thruster cavity, an injected amount of propellant may absorb energy from a microwave source (that may include one or more oscillators) included in the thruster system 180 and, upon partial ionization, further heat up, expand, and exit the MET thruster cavity through a nozzle, generating thrust.

Another one or more thrusters in the primary propulsion subsystem 182 may be solar thermal thrusters. In one implementation, propellant in a thruster cavity acts as the solar thermal receiver and, upon absorbing concentrated solar energy, heats up, expands, and exits the nozzle generating thrust. In other implementations, the propellant may absorb heat before entering the cavity either as a part of the thermal target or in a heat exchange with the thermal target or another suitable thermal mass thermally connected to the thermal target. In some implementations, while the propellant may absorb heat before entering the thruster cavity, the primary propulsion thruster subsystem 182 may add more heat to the propellant within the cavity using an electrical heater or directing a portion of solar radiation energy to the cavity.

Thrusters in the attitude adjustment subsystem 184 may use propellant that absorbs heat before entering the cavities of the attitude adjustment thrusters in a heat exchange with the thermal target or another suitable thermal mass thermally connected to the thermal target. In some implementations, while the propellant may absorb heat before entering thruster cavities, the thrusters of the attitude adjustment thruster subsystem 184 may add more heat to the propellant within the cavity using corresponding electrical heaters.

The propellant system 190 may store the propellant for use in the thruster system 180. The propellant may include water, hydrogen peroxide, hydrazine, ammonia or another suitable substance. The propellant may be stored on the spacecraft in solid, liquid, and/or gas phase. To that end, the propellant system 190 may include one or more tanks, including, in some implementations, deployable tanks. To move the propellant within the spacecraft 100, and to deliver the propellant to one of the thrusters, the propellant system 190 may include one or more pumps, valves, and pipes. The propellant may also store heat and/or facilitate generating electricity from heat, and the propellant system 190 may be configured, accordingly, to supply propellant to the power system 170.

The mechanism control 130 may activate and control mechanisms in the docking system 160 (e.g., for attaching and detaching a payload or connecting with an external propellant source), the power system 170 (e.g., for deploying and aligning solar panels or solar concentrators), and/or the propellant system 190 (e.g., for changing configuration of one or more deployable propellant tanks). Furthermore, the mechanism control 130 may coordinate interaction between subsystems, for example, by deploying a tank in the propellant system 190 to receive propellant from an external propellant source connected to the docking system 160.

The solar array control 135 may control coiling and uncoiling of the rollable solar array system 175. The solar array control 135 may initiate uncoiling of the rollable solar array system 175, and the rollable solar array has stored potential energy to unroll independent of any assistance from other components (e.g., motors, springs, etc.). The solar array control 135 may further control one or more motors to control a speed of coiling and/or uncoiling of the rollable solar array. Further, the solar array control 135 may also control an orientation of the rollable solar array.

The propulsion control 140 may coordinate the interaction between the thruster system 180 and the propellant system 190, for example, by activating and controlling electrical components (e.g., a microwave source) of the thruster system 140 and the flow of propellant supplied to thrusters by the propellant system 190. Additionally or alternatively, the propulsion control 140 may direct the propellant through elements of the power system 170. For example, the propellant system 190 may direct the propellant to absorb the heat (e.g., at a heat exchanger) accumulated within the power system 170. Vaporized propellant may then drive a power plant (e.g., a turbine, a Stirling engine, etc.) of the power system 170 to generate electricity. Additionally or alternatively, the propellant system 190 may direct some of the propellant to charge a fuel cell within the power system 190. Still further, the altitude adjustment thruster subsystem 184 may directly use the heated propellant to generate thrust.

The subsystems of the spacecraft may be merged or subdivided in different implementations. For example, a single control unit may control mechanisms and propulsion. Alternatively, dedicated controllers may be used for different mechanisms (e.g., a pivot system for a solar concentrator), thrusters (e.g., a MET thruster), valves, etc. In the following discussion, a controller may refer to any portion or combination of the mechanism control 130 and/or propulsion control 140.

Figure 2A:
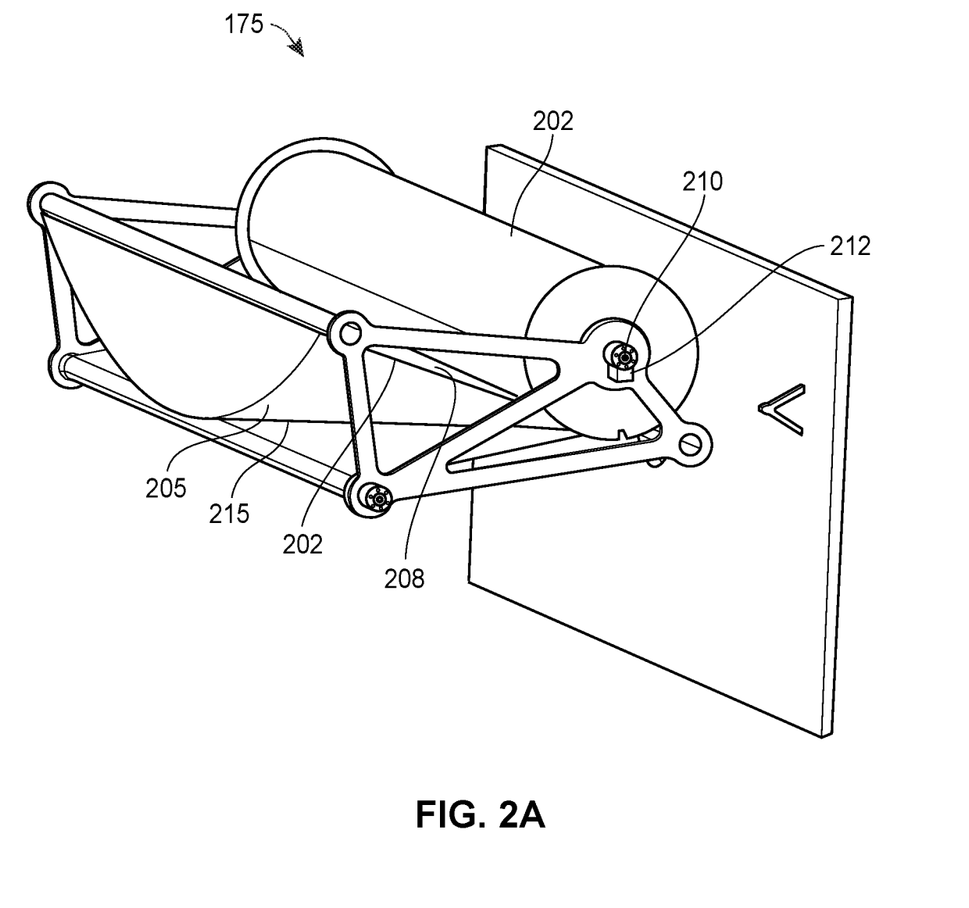
FIG. 2A is a perspective view of a rollable solar array system for harvesting solar energy on a spacecraft.
Figure 2B:
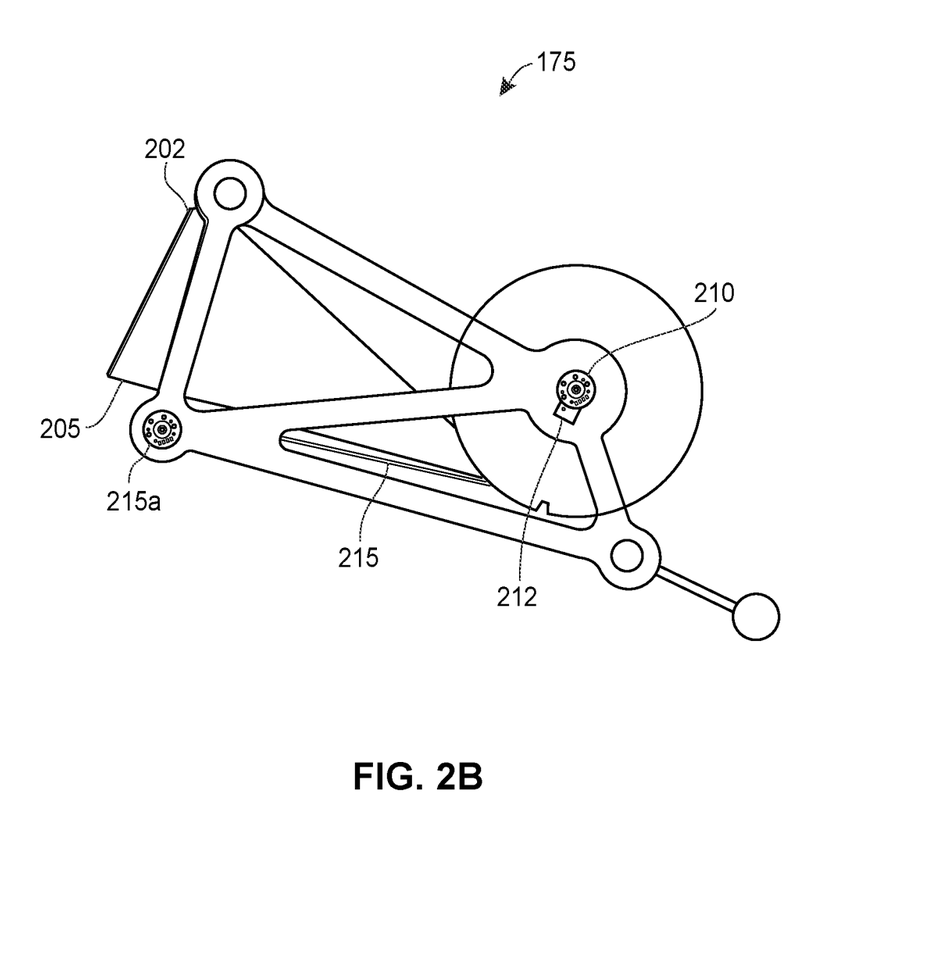
FIG. 2B is a side view of a rollable solar array system for harvesting energy on a spacecraft.

FIGS. 2A and 2B are a perspective view and a side view, respectively, of a rollable solar array system 175 for harvesting solar energy on a spacecraft. The rollable solar array system 175 includes a rollable solar array panel 202. The rollable solar array panel 202 includes a stiff substrate 205 and a working layer 208. In some implementations, the rollable solar array panel 202 also can include support elements such as wiring or harnessing running along one or both sides of the substrate 205, adhesives, mechanical fasteners, emissive coatings etc.

The stiff substrate 205 is a flexible material that has a stiff concave geometry in one direction allowing it to store mechanical potential energy when rolled. Therefore, the substrate 205 itself operates as a tape spring when rolled into a first operational state being a coiled state, as illustrated in FIGS. 2A and 2B. In the coiled state, the rollable solar array panel 202 may be coiled in an equal-sense (i.e., with substrate 205 radius of curvature in a direction towards a central coiling axis), or an opposite sense (i.e., substrate 205 radius of curvature in a direction opposite the central coiling axis). The central coiling axis is an axis around which the rollable solar array panel 202 is coiled when in the coiled state. The substrate 205 may include aluminum, stainless steel, carbon fiber, fiberglass, or another stiff material capable of storing mechanical energy when in a coiled state. Further, the substrate 205 may be a material that is heat treated to increase the stiffness and/or strength of the material. In an uncoiled, unrolled state, the stiff concave geometry of the substrate 205 maintains a shape of the rollable solar array panel 202 without requiring any booms or mechanical supports. By removing the need for mechanical booms and supports the rollable solar array system 175 weighs less, is more compact, and costs less than other solar array systems. Further, buckling and mechanical failures are reduced by removing the need for booms to provide an external tension on the solar array panel 202. In various implementations, the rollable solar array panel 202 may include a cross-brace along the cross-section of the solar array panel 202 to increase rigidity of the rollable solar array panel 202.

The working layer 208 is disposed on the substrate 205 to provide at least one of a photovoltaic function or a reflective function. For example, the working layer 208 may include one or more photovoltaic cells for harvesting solar energy. In another example, the entire working layer 208 may be reflective elements for focusing of radiation onto other components, or focusing onto energy harvesting elements. The working layer 208 may include both energy harvesting elements such as photovoltaic cells, and reflective elements such as mirrors to perform as both a solar concentrator and a photovoltaic module.

The rollable solar array system 175 may include a central mandrel 210 around which the rollable solar array panel 202 is coiled when in the coiled state. The rollable solar array panel 202 may be physically coupled to the mandrel 210, or the rollable solar array panel 202 may be wrapped around the mandrel 210 without being secured to or physically attached to the mandrel 210. In embodiments, the mandrel 210 may be a cylindrical mandrel, a polygonal mandrel, or another shape or mandrel according to the physical shape of the substrate 205.

In an example implementation, the rollable solar array panel 202 in the coiled state is arranged in approximately 40 coils. In the uncoiled state, the solar array panel 202 is approximately 10 meters along the direction in which the solar array panel 202 uncoils.

In another implementation, the solar array panel 202 is folded and arranged as an accordion spring rather than a tape spring. Similar to the tape spring, the substrate arranged as an accordion spring can store potential energy in a compressed state and, when released, flatten out to form a solar array and/or a solar concentrator.

A motor 212 may be operatively coupled to the mandrel to control rotation of the mandrel 210 and therefore, control the coiling or uncoiling of the rollable solar array panel 202. The motor 212 may be used to limit the speed of unrolling of the rollable solar array panel 202 either by controlling the rotation of the mandrel 210 in the direction of unrolling, or the motor 212 may provide a force against the direction of rotation of unrolling. For example, the potential energy stored in the coiled rollable solar array panel 202 may provide enough energy to fully uncoil the rollable solar array panel 202, and the motor 212 may provide a force against the unrolling to regulate the speed of unrolling due to the release of the potential energy. In embodiments, a plurality of motors may be used to control the coiling, and/or uncoiling of the rollable solar array panel 202. In the described embodiments, a motor is not required for uncoiling of the rollable solar array panel 202. The stiff substrate 205 of the rollable solar array panel 202 may store enough energy to fully deploy and unroll unassisted by any other outside forces or components.

A sensor element may be used to determine if the rollable solar array panel 202 is coiled, uncoiled, and/or a speed at which the rollable solar array panel 202 is coiling or uncoiling. For example, the motor 212 may include an optical encoder that detects how much the rollable solar array panel 202 has coiled/uncoiled, or a speed at which the solar array panel 202 is coiling/uncoiling. The optical encoder may then provide a signal indicative of the state or speed of coiling/uncoiling to the motor 212 and the motor 212 may provide a force to the solar array panel 202, or other elements, to control a speed or the state of the rollable solar array panel 202. The sensor element may include one or more optical sensors, force sensors, pressure sensors, motion sensor, or another sensor.

A spacer layer 215 may be used to separate adjacent layers of the coiled solar array panel 202. The spacer layer 215 may be used to squeeze the coiled layers of the coiled solar array panel 202 to further compress the solar array panel 202 while in the coiled state. Further, the spacer layer 215 assists in uncoiling of the rollable solar array panel 202 during uncoiling by preventing ballooning of the rollable solar array panel 202. Ballooning during uncoiling may cause the solar array panel 202 to physically bump or otherwise collide with other mechanical components which may damage the solar array panel 202, or other components of the rollable solar array system 175 or the spacecraft. The space layer may be physically coupled to a spacer mandrel 215a, and a motor or other mechanical drive, either independent or coupled to the central mandrel, may be physically coupled to the spacer mandrel 215a to provide a force to the spacer layer 215 that facilitates uncoiling of the solar array panel 202. The spacer layer 215 may be wrapped around the spacer layer mandrel 215a during uncoiling of the solar array panel 202, and the spacer layer 215 may be stored around the spacer layer mandrel 215a until coiling of the solar array panel 202 is initiated.

Figure 2C:
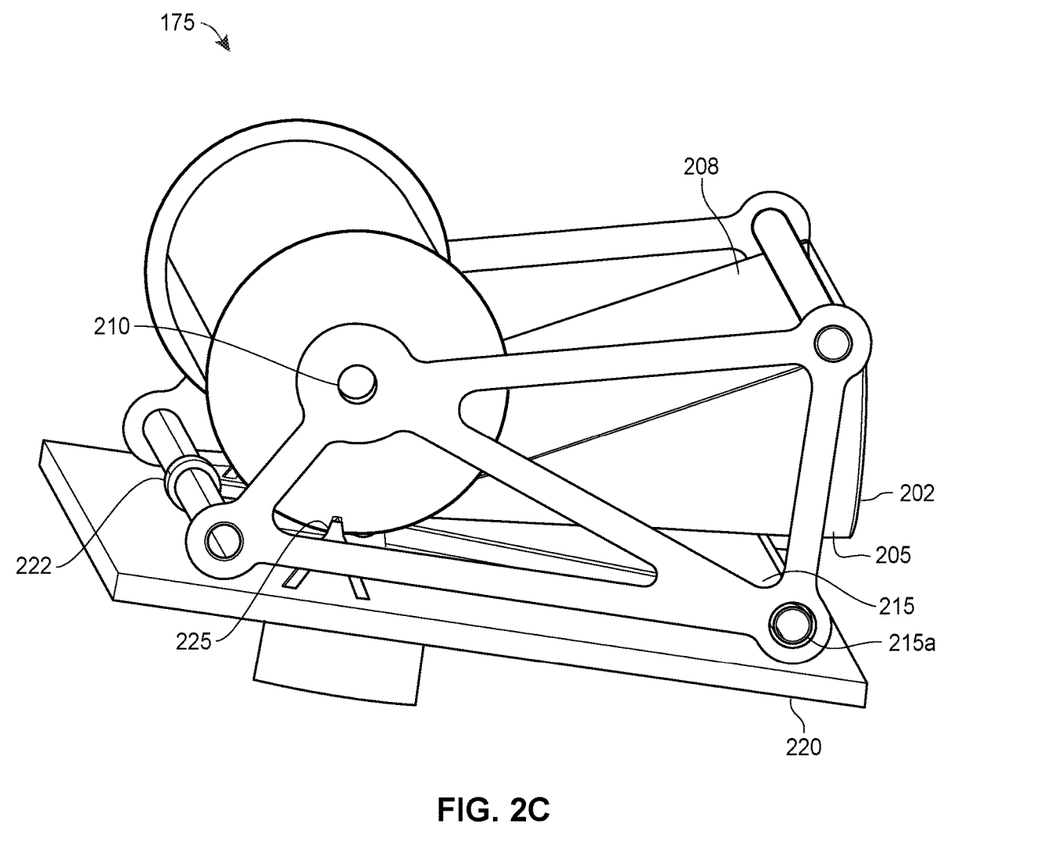
FIG. 2C is a perspective view of the rollable solar array system of FIGS. 2A and 2B illustrated in a stored configuration.
Figure 3A:
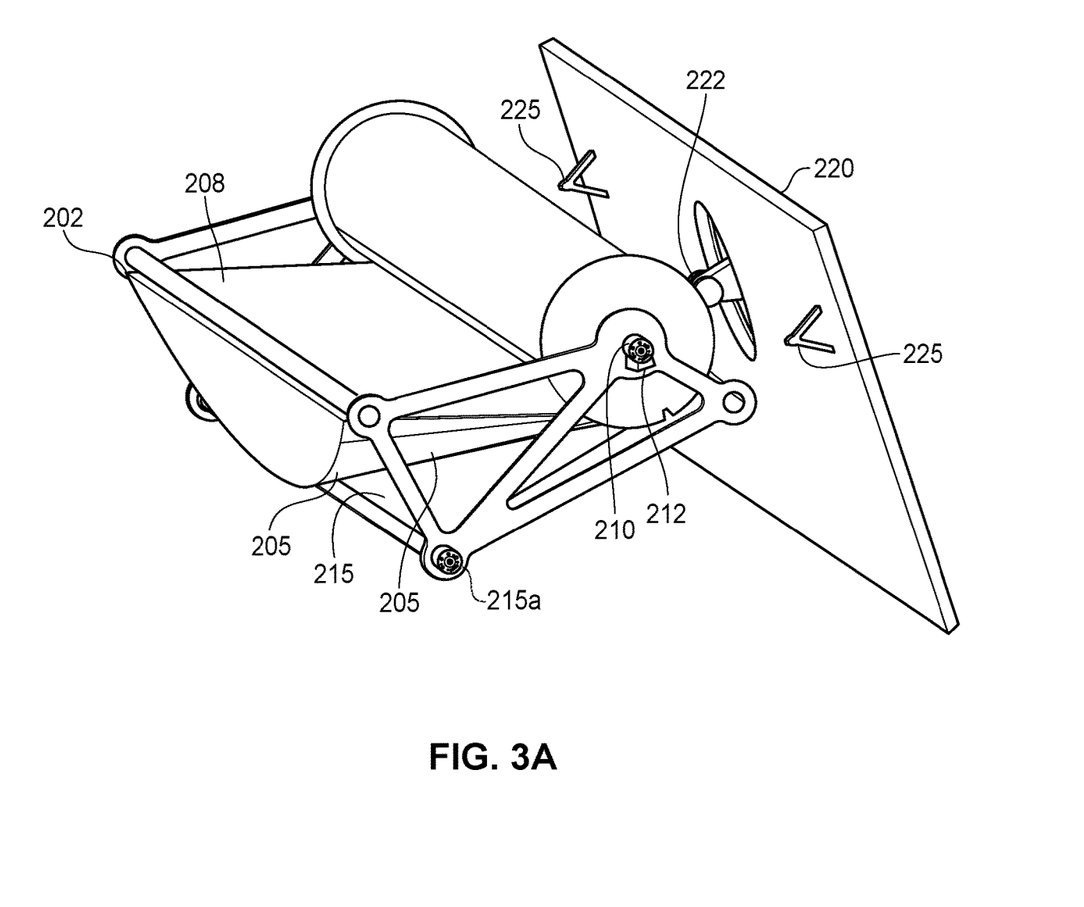
FIG. 3A is a first perspective view of the rollable solar array system in for FIGS. 2A-2C in an unfolded configuration.
Figure 3B:
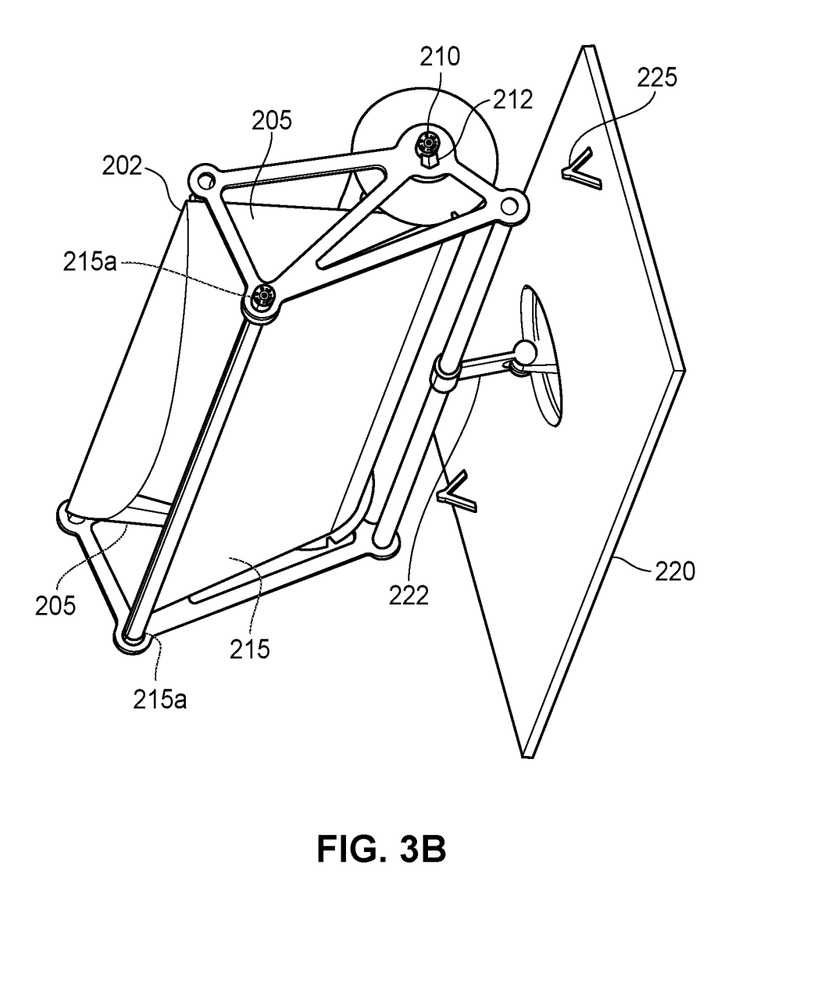
FIG. 3B is a second perspective view of the rollable solar array system in for FIGS. 2A-2C in an unfolded configuration.

The rollable solar array system 175 of FIG. 2C, is illustrated in a stored configuration against a mounting panel 220. The stored configuration may be useful for storing the rollable solar array system 175 during launch of a spacecraft. FIGS. 3A and 3B depict the rollable solar array system 175 in an unfolded configuration. The rollable solar array system 175 is physically coupled to a mounting arm 222 that supports a position of the rollable solar array system 175 and couples the rollable solar array system 175 to the mounting plate 220.

The rollable solar array system 175 may include a locking mechanism to prevent unrolling of the rollable solar array panel 202 (e.g., during launch, while maneuvering the spacecraft, in proximity to other celestial objects, etc.). For example, as illustrated in FIG. 2C, the locking mechanism may be a wedge 225 physically coupled to the mounting panel 220. In the stored configuration, the wedge 225 is positioned inside of a notch of a gear coupled to the central mandrel 210 to prevent rotation of the central mandrel 210, and therefore, to prevent uncoiling of the rollable solar array panel 202. Force may be applied to the other end of the array to tension it tightly against the mandrel. A motor or actuator may control the mounting arm 222 to move the rollable solar array system 175 from the stored configuration to the unfolded configuration. In the unfolded configuration, illustrated in FIGS. 3A and 3B, the rollable solar array system 175 is disengaged from the wedge 225 allowing uncoiling and coiling of the rollable solar array panel 202. The locking mechanism for example may include one or more of a motor to prevent rotation of the central mandrel, or of uncoiling of the rollable solar array panel 202, a clamp that holds the rollable solar array panel 202 in place, a pin to stop the array from rotating, or a band clamp around the entire array.

Figure 4:
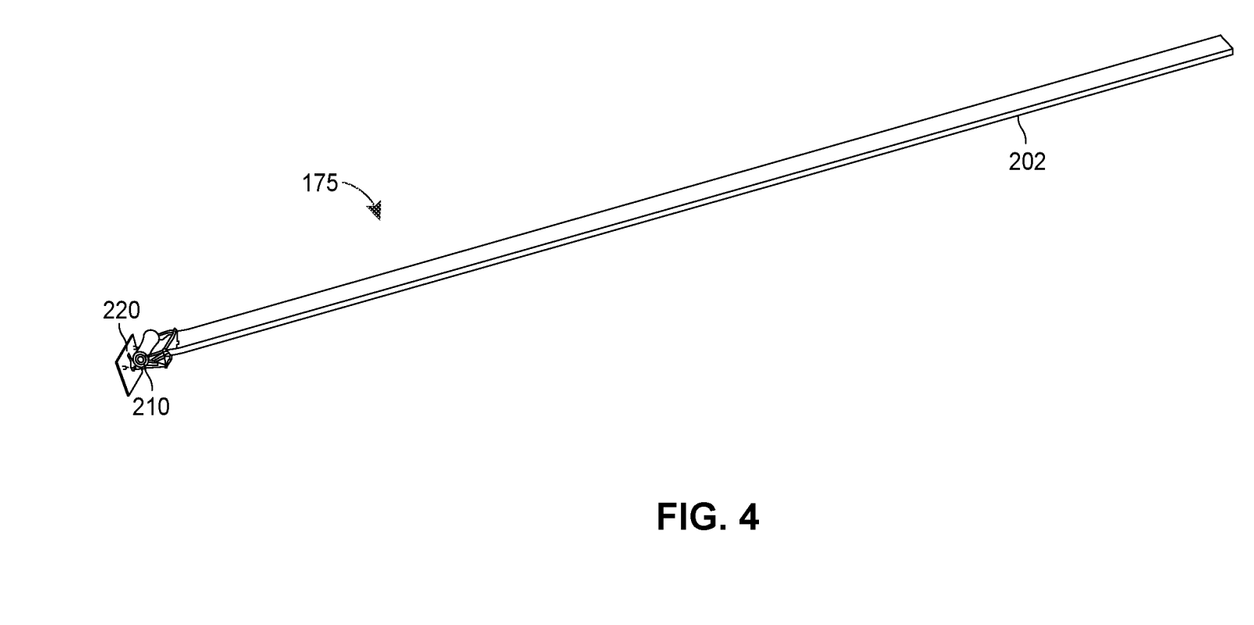
FIG. 4 is a perspective view of a rollable solar array system with a rollable solar array panel in an uncoiled state.

FIG. 4 is a perspective view of the rollable solar array system 175 with the rollable solar array panel 202 in the uncoiled state. The uncoiled rollable solar array panel 202 has a stiff concave surface shape that provides a tension across the substrate 205 that provides structural support to the rollable solar array panel 202. The concave surface shape also helps prevent buckling or bending of the rollable solar array panel 202, which reduces the likelihood of damage or malfunction of the rollable solar array panel 202.

Figure 5A:
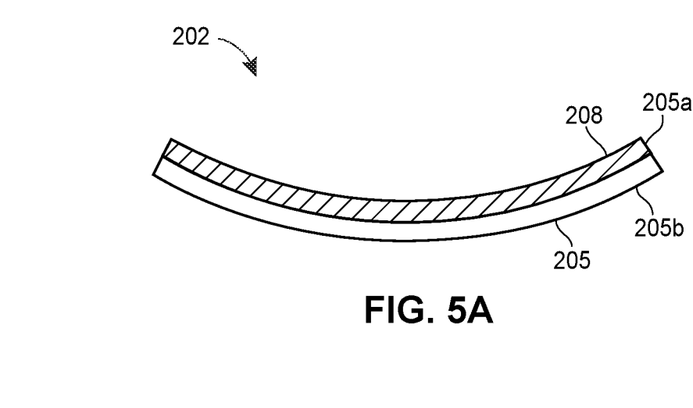
FIG. 5A is a cross-sectional view of a solar panel having a curved substrate with a flexible working layer disposed on an inner surface of the substrate.
Figure 5B:
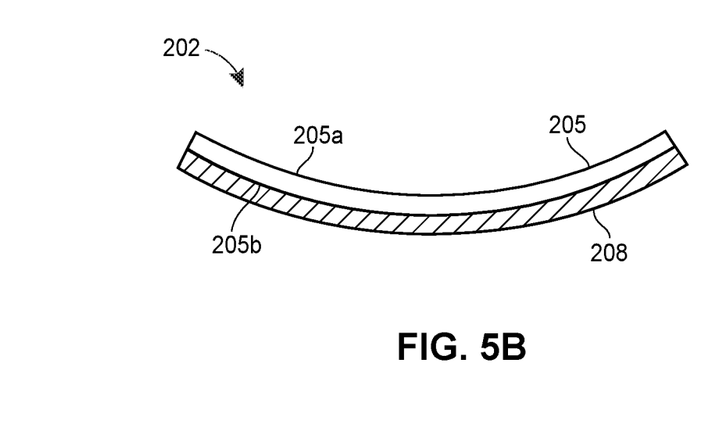
FIG. 5B is a cross-sectional view of a solar panel having a curved substrate with a flexible working layer disposed on an outer surface of the substrate.
Figure 5C:
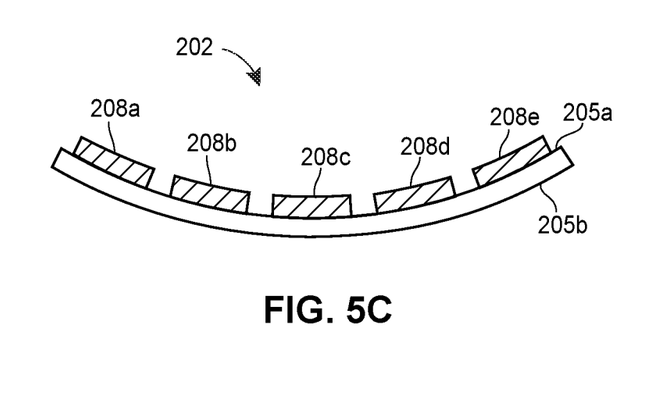
FIG. 5C is a cross-sectional view of a solar panel having a curved substrate with a segmented rigid working layer disposed on an inner surface of the substrate.
Figure 5D:
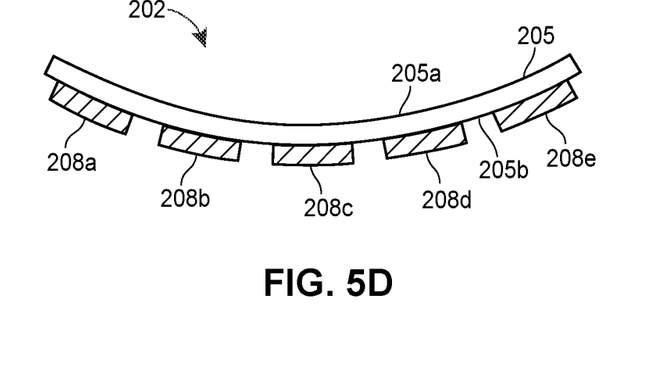
FIG. 5D is a cross-sectional view of a solar panel having a curved substrate with a segmented rigid working layer disposed on an outer surface of the substrate.

FIGS. 5A-5D are cross-sections of embodiments of solar panels 202 having a concave surface shape. The solar panels 202 have a stiff substrate 205 and working layers 208 disposed on the substrate 205. FIG. 5A illustrates a solar panel 202 with the working layer 208 disposed on an inner surface 205a of the substrate 205. The solar panel configuration 202 of FIG. 5A may be implemented to focus or concentrate solar radiation onto a target. As illustrated in FIG. 5B, the working layer 208 may be disposed on an outer surface 205b (i.e., the convex surface) of the substrate 202. Having the working layer 208 on the outer surface 205b of the substrate 202 increases the surface area of the working layer 208 allowing for a larger active region for absorption or reflection of solar radiation. FIGS. 5A and 5B illustrate embodiments with a flexible working layer 208 that bends according to the shape of the substrate 205. The working layer 208 in this implementation can be deposited onto the substrate 205 similar to fabric. Alternatively, FIGS. 5C and 5D employ rigid working layer elements 208a-208e that are arranged into a segmented working layer. FIG. 5C illustrates the rigid working layer elements 208a-208e disposed on the inner surface 205a of the substrate 205, while FIG. 5D illustrates the working layer elements 208a-208e being on the outer surface 205b of the substrate. The sizes of the working layer elements 208a-208e, and the distances between working layer elements 208a-208e may depend on the rigidity of the material of the working layer elements, 508a-508e, a radius of curvature of the inner surface 205a, and the sizes and shapes of the working layer elements 208a-208e. In embodiments, the working layer elements 208a-208e are arranged with respective gaps such that the working layer elements 208a-208e physically contact each other in the coiled state of the rollable solar array panel 202. While illustrated in FIGS. 5A-5D as being on either the inner surface 205a or the outer surface 205b, in examples, the working layers 208 and working layer elements 208a-208e may be disposed on both the inner and outer surfaces 205a and 205b.

In another implementation, the gaps between the working layer elements 208a-208e are minimized by affixing these elements to the substrate 202 in the center, which allows the edges to slide past each other like scales.

Figure 6:
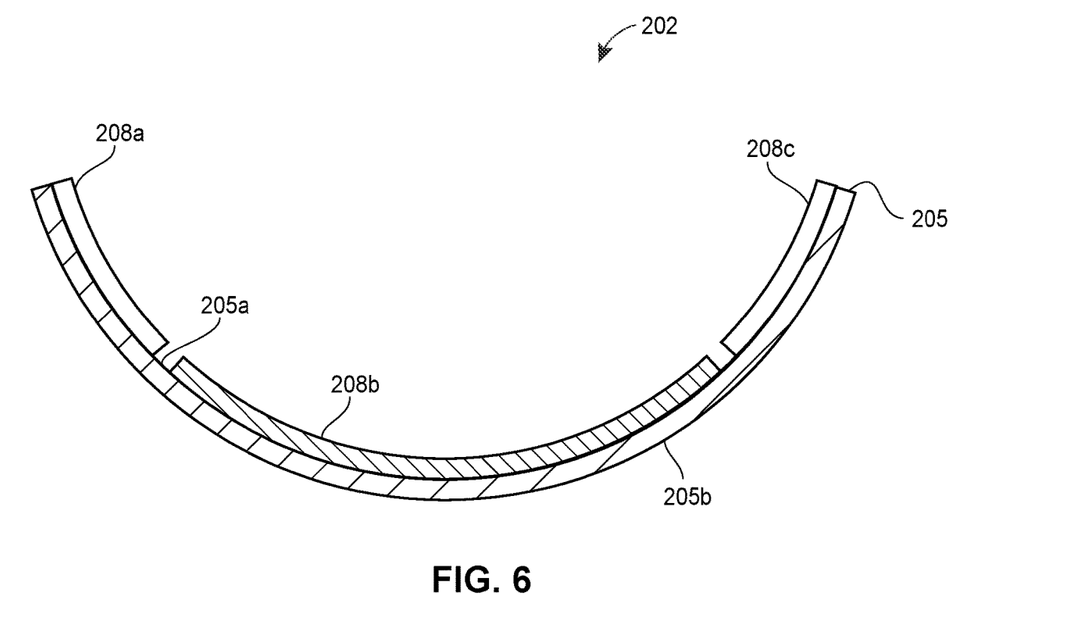
FIG. 6 is a cross-sectional view of a solar panel having a curved substrate with a plurality of working layer elements.

FIG. 6 illustrates a cross-section view of an embodiment of a concave solar panel 202 as a tape spring having a substrate 205, and working layer elements 208a, 208b, and 208c. The working layer elements 208-208c are disposed on inner surface 205a of the substrate 205. The substrate is a stiff material with the inner surface 205a being a concave surface having a radius of curvature. The working layer elements 208a-208b may be one or more of a photovoltaic cell, a reflective element (e.g., a mirror), a refractive element, a filter, an absorptive element, or another element for directing radiation or otherwise interacting with solar radiation. In an example, working layer element 208b is a photovoltaic cell configured to absorb solar radiation, and the working layer elements 208a and 208c are reflective elements configured to reflect radiation onto the photovoltaic cell (i.e., working layer element 208b). The reflective elements focus radiation onto the photovoltaic cell, increasing the amount of radiation incident on, and absorbed by, the photovoltaic cell. In embodiments, the working layer elements 208a and 208c may be reflective elements and the working layer element 208b may be a thermal element configured to absorb radiation and to generate, or direct heat energy generate by absorption of the radiation. In any of the described embodiments, the working layer elements 208a-208c may be flexible materials, or rigid segmented materials as previously described in reference to FIGS. 5A through 5D.

Figure 7:
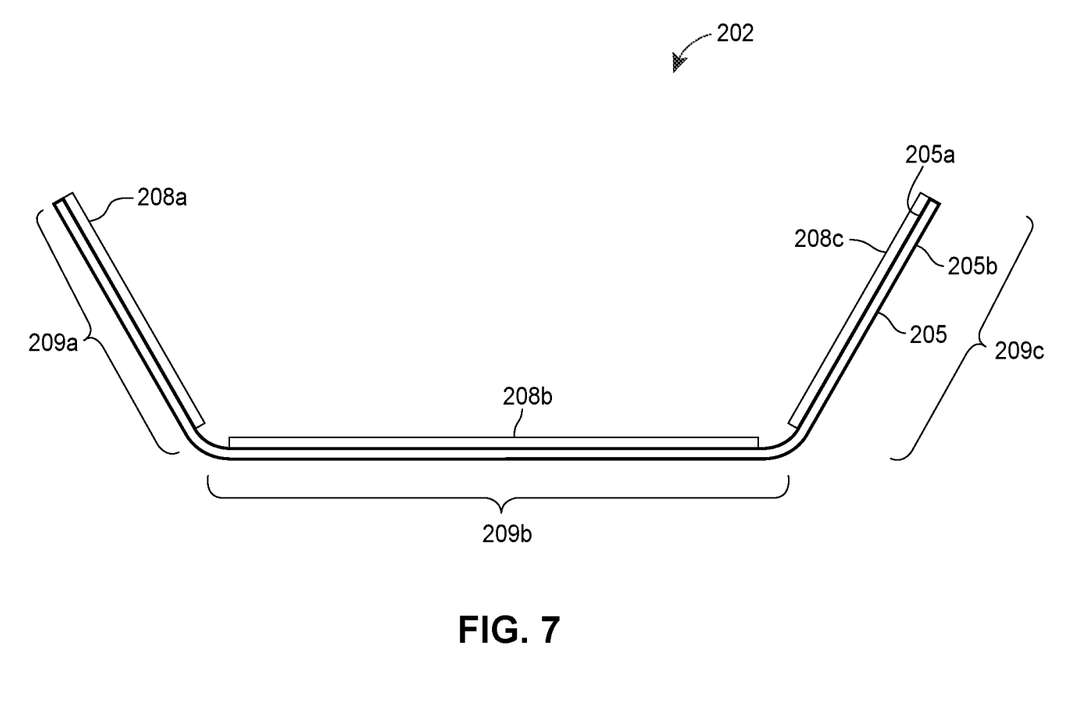
FIG. 7 is a cross-sectional view of a solar panel having a piece-wise linear substrate with a plurality of working layer elements.

FIG. 7 illustrates a cross-sectional view of an embodiment of a solar panel 202 with a substrate 205 that has a piece-wise linear surface shape. The substrate 205 has a first linear section 209a, a second linear section 209b, and a third linear section 109c. Each linear section includes a corresponding working layer element 208a-208c disposed on the first surface 205a of the substrate 205. The working layer element 208b may be a photovoltaic cell, or radiation absorbing element, and the working layer elements 208a and 208c may be reflective elements configured to reflect radiation onto the radiation absorbing element 208b. While specific examples have been discussed, the working layer elements 208a-208c in FIGS. 6 and 7 may independently be reflective elements (i.e., mirrors, filters, dichroic mirrors, etc.), absorptive elements (i.e., photovoltaic cells, a thermal energy element, etc.) or another type of element or material that interacts with solar radiation.

In the example configuration illustrated in FIG. 7, reflective element 208a reflects light that is incident on its surface toward the photovoltaic element 208b. Reflective element 208c similarly reflects light that is incident on its surface toward the photovoltaic element 208b. To this end, the substrate 205 is arranged to provide the corresponding angles of incidence and reflection, in the released state. In this manner, the reflective elements 208a and 208c can augment the output of the photovoltaic element 208b under low optical concentration. In another configuration, however, all of the elements 208a-c are reflective, and the substrate 205 is arranged so that the elements 208a-c reflect solar energy toward a thermal target (not shown) disposed away from the solar panel 202.

The curved and piece-wise geometries of the substrates 202 depicted in FIGS. 6 and 7, respectively, are two examples surface shapes of a tape-spring substrate. The substrate 205 may be another shape that stores energy when in a coiled state, for example, the substrate may have a cross-sectional geometry that is a circular curve, parabolic, polygonal, curvilinear, or a standard tape spring shape. In an example implementation, the cross-section of the substrate 205 is approximately a 60-degree arc. Further, the geometry of the cross-section of the substrate 205 may vary along a length of the solar panel 202 which may include one or more of a change in shape, substrate 205 and/or working layer 208 thicknesses, and substrate 205 and/or working layer 208 material properties. Additionally, the inner and outer surfaces 205a and 205b of the substrate 205 may include surface elements or textures to increase or decrease the stiffness of the tape spring. Controlling the stiffness of the tape spring may allow for control of the amount of energy stored in the tape spring in the coiled state, which allows for tuning of a deployment, or uncoiling speed/acceleration, of the tape spring.

Figure 8:
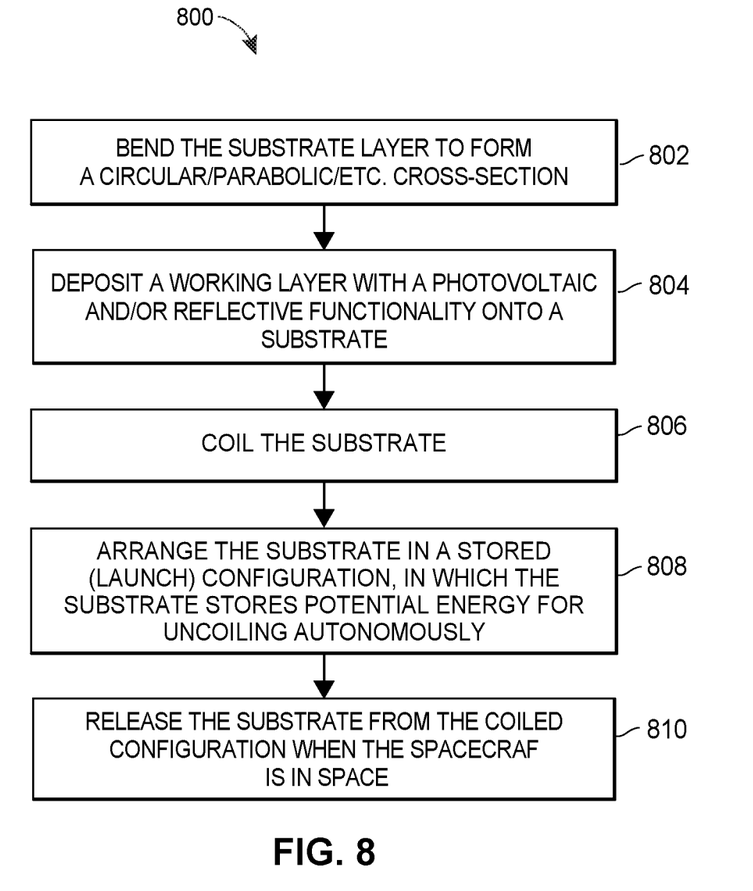
FIG. 8 is a flow diagram of a method for providing a photovoltaic module and/or a solar concentrator in a spacecraft.

Now referring to FIG. 8, a method 800 for providing a photovoltaic module and/or a solar concentrator in a spacecraft can begins at block 804, where a working layer is deposited on a stiff substrate layer. As discussed above, the working layer can provide at least one of a photovoltaic or a reflective function, and the working layer can be directly bonded to the substrate.

In some implementations, block 802 is executed prior to block 804. At block 802, the substrate layer is bent to form a suitable cross-section (e.g., circular) that results in the substrate layer forming a desired shape (e.g., a spherical cap) in the released state. In another implementation, however, block 802 is executed after block 804, in which case the working layer is bent along with the substrate.

The method 800 also can include block 806, where the substrate layer and the working layer are coiled to form a tape spring. In another implementation, however, the method 800 includes a different step at which the substrate is folded to form another type of a spring such as an according spring for example.

Next, at block 808, the substrate (along with the working layer) is arranged in a stored configuration for launch. The substrate in this configuration stores potential energy for uncoiling or unfolding when the substrate is released. At block 810, the spacecraft deploys the solar panel and/or the solar concentrator in which the substrate is implemented, so as to convert the potential energy stored in the substrate to kinetic energy, which causes the substrate to define a solar array and/or a solar concentrator.

What is claimed is:

1. A system for harvesting solar energy on a spacecraft, the system comprising:
   a solar array panel comprising (i) a stiff substrate layer and (ii) a working layer disposed on the substrate layer to provide at least one of a photovoltaic or a reflective function; and
   a spacer layer,
      wherein the substrate layer, in a first operational state, is arranged as a tape spring to store potential energy which causes the substrate layer to uncoil to a second operational state in which the solar array panel provides a photovoltaic module and/or a solar concentrator,
      wherein, in the second operational state, the substrate layer has a radius of curvature in a direction orthogonal to a central coiling axis around which the substrate layer is coiled in the first operational state,
      wherein, when the substrate layer is in the first operational state, the spacer layer (i) is disposed between adjacent coils of the solar array panel and (ii) is configured to compress the coils of the solar array panel around an axis of rotation, and
      wherein the spacer layer is coupled to a drive mechanism that applies a force to the spacer layer to facilitate uncoiling of the solar array panel.

2. The system of claim 1, wherein the substrate layer is arranged to store sufficient potential energy to fully uncoil without assistance from any other components.

3. The system of claim 1, further comprising:
   an uncoiling mechanism configured to apply a supplemental force in a direction in which the substrate layer uncoils to transition to the second operational state.

4. The system of claim 1, wherein the working layer is disposed on a concave surface of the substrate layer.

5. The system of claim 1, wherein the working layer is disposed on the convex surface of the substrate layer.

6. The system of claim 1, wherein:
   the working layer is a first working layer disposed on the convex surface of the substrate layer; and
   the system further comprises a second working layer disposed on the concave surface of the substrate layer.

7. The system of claim 1, wherein a cross-section of the substrate layer is circular, parabolic, curvilinear, or piece-wise-linear.

8. The system of claim 1, wherein a cross-section of the substrate layer varies along a direction in which the substrate layer uncoils to transition to the second operational state.

9. The system of claim 1, wherein the working layer includes a flexible photovoltaic layer that is configured to coil with the substrate layer.

10. The system of claim 1, wherein the working layer includes a plurality of rigid photovoltaic cells spaced apart on the substrate layer.

11. The system of claim 1, wherein the substrate layer, in the first operational state, is arranged around a mandrel.

12. The system of claim 1, wherein the substrate layer includes at least one of:
   aluminum,
   stainless steel,
   carbon fiber, or
   fiberglass.

13. The system of claim 1, wherein the working layer includes:
   a photovoltaic portion disposed on a first region of the substrate layer, and
   a reflective portion disposed on a second region of the substrate layer;
   wherein the substrate layer is shaped to direct light incident on the reflective portion to the photovoltaic portion.

14. The system of claim 1, further comprising:
   a locking mechanism configured to prevent the substrate layer from uncoiling in the first operational state.

15. The system of claim 14, further comprising:
   a disengaging mechanism operatively coupled to the locking mechanism and configured to actuate the locking mechanism so as to allow the substrate layer to transition to the second operational state.

16. The system of claim 1, further comprising:
a motor configured to control a rate at which the substrate layer uncoils to transition to the second operational state.

17. A method of providing a photovoltaic module and/or a solar concentrator in a spacecraft, the method comprising:
forming a solar array panel by depositing a working layer on a stiff substrate layer, the working layer configured to provide at least one of a photovoltaic or a reflective function; and
arranging the solar array panel in a stowed configuration on a spacecraft, with a spacer layer disposed between adjacent coils of the solar array panel,
wherein the spacer layer compresses the coils of the solar array panel around an axis of rotation,
wherein the substrate layer, when the solar array panel is in the stowed configuration, is configured to store potential energy which, when the solar array panel is released from the stowed configuration, causes the substrate layer to uncoil to a released configuration in which the solar array panel provides a photovoltaic module and/or a solar concentrator for the spacecraft, and
wherein the spacer layer is coupled to a drive mechanism that applies a force to the spacer layer to facilitate uncoiling of the solar array panel.

18. The method of claim 17, wherein arranging the solar array panel includes coiling the substrate layer to form a tape spring.

19. The method of claim 18, further comprising:
bending the substrate layer to form a circular, parabolic, or piecewise-linear cross-section prior to the coiling.

20. The method of claim 18, including coiling the substrate layer around a mandrel.

21. The method of claim 17, wherein depositing the working layer on the substrate layer includes directly bonding the working layer to the substrate layer.

22. The system of claim 1, wherein a cross-section of the substrate layer in the second operational state is curvilinear, and wherein the working layer includes a plurality of working layer elements.

23. The method of claim 18, wherein a cross-section of the substrate layer in the released configuration is curvilinear, and wherein the working layer includes a plurality of working layer elements.

* * * * *